United States Patent
Turvey

(10) Patent No.: US 6,232,815 B1
(45) Date of Patent: May 15, 2001

(54) ATE PIN ELECTRONICS WITH COMPLEMENTARY WAVEFORM DRIVERS

(75) Inventor: Anthony E. Turvey, Reading, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/306,315

(22) Filed: May 6, 1999

(51) Int. Cl.[7] .................................. G06F 1/04; H03K 3/00
(52) U.S. Cl. ........................ 327/291; 327/298; 327/106; 327/74; 327/71
(58) Field of Search ................... 327/53, 56, 52, 327/280, 287, 560–563, 355, 361, 362, 410, 412, 413, 105, 106, 478, 482, 423, 432, 291, 298, 170, 74, 76–78, 70–71; 330/252

(56) References Cited

U.S. PATENT DOCUMENTS

| | | | |
|---|---|---|---|
| 4,001,605 | * 1/1977 | Thomas et al. | 327/355 |
| 4,131,846 | * 12/1978 | Stone | 324/132 |
| 4,445,054 | * 4/1984 | Ishii | 327/77 |
| 4,540,953 | * 9/1985 | Togari et al. | 330/284 |
| 4,572,971 | 2/1986 | Necoechea | 327/108 |
| 4,683,441 | * 7/1987 | Naylor | 330/69 |
| 4,695,806 | * 9/1987 | Barrett | 330/254 |
| 4,797,586 | * 1/1989 | Traa | 327/287 |
| 5,010,297 | 4/1991 | Babcock | 324/763 |
| 5,179,293 | 1/1993 | Hilton | 327/480 |
| 5,266,887 | * 11/1993 | Smith | 330/253 |
| 5,345,237 | * 9/1994 | Kouno et al. | 330/252 |
| 5,500,615 | * 3/1996 | Bater | 327/362 |
| 5,506,537 | * 4/1996 | Kimura | 327/351 |
| 5,729,161 | * 3/1998 | Corsi | 327/65 |
| 5,842,155 | 11/1998 | Bryson et al. | 702/124 |
| 5,905,396 | * 5/1999 | Nishiyama | 327/563 |
| 5,914,630 | * 6/1999 | Peterson | 327/563 |
| 5,923,207 | * 7/1999 | Jung | 327/413 |
| 6,037,823 | * 3/2000 | Arai et al. | 327/307 |
| 6,166,569 | * 12/2000 | McQuilkin | 327/105 |

* cited by examiner

Primary Examiner—Terry D. Cunningham
Assistant Examiner—Long Nguyen
(74) Attorney, Agent, or Firm—Koppel & Jacobs

(57) ABSTRACT

A complementary waveform driver is disclosed that generates output signals $S_{OUT}$ with arbitrary high and low drive states with respect to an independently controlled baseline signal $S_{BL}$. Accordingly, the driver can generate very fast and flexible waveforms with multiple levels and baseline components. The driver implements complementary differential pairs of transistors that alternately source and sink programmable currents to an output port, creating an output waveform with excellent rising and falling edge symmetry, and greatly improved fidelity, especially at low level voltage swings. A complementary amplifier stage defines the baseline voltage level. When combined with a programmable active load and window comparator, the driver is particularly suited for pin electronics in automatic test equipment (ATE) applications.

27 Claims, 7 Drawing Sheets

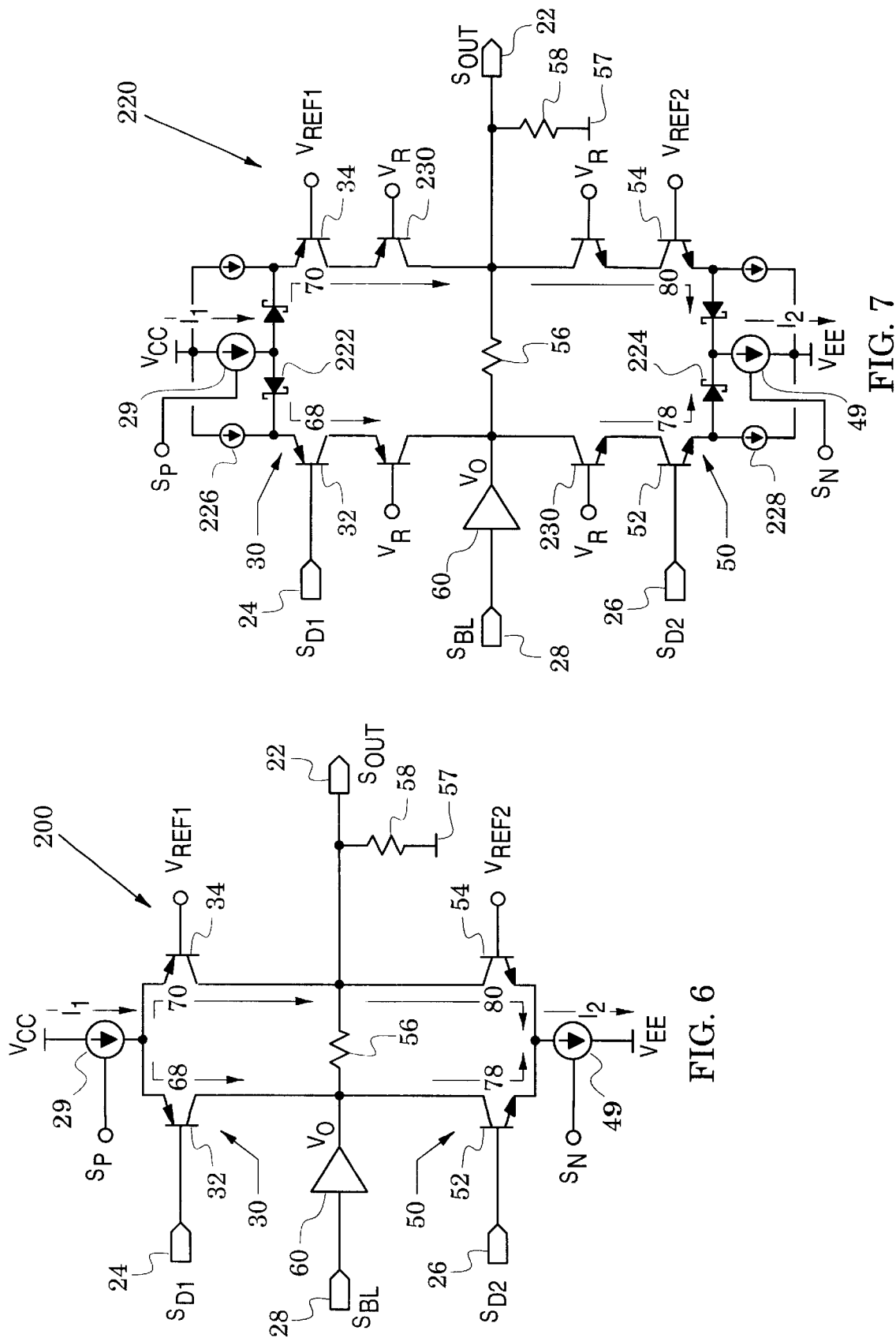

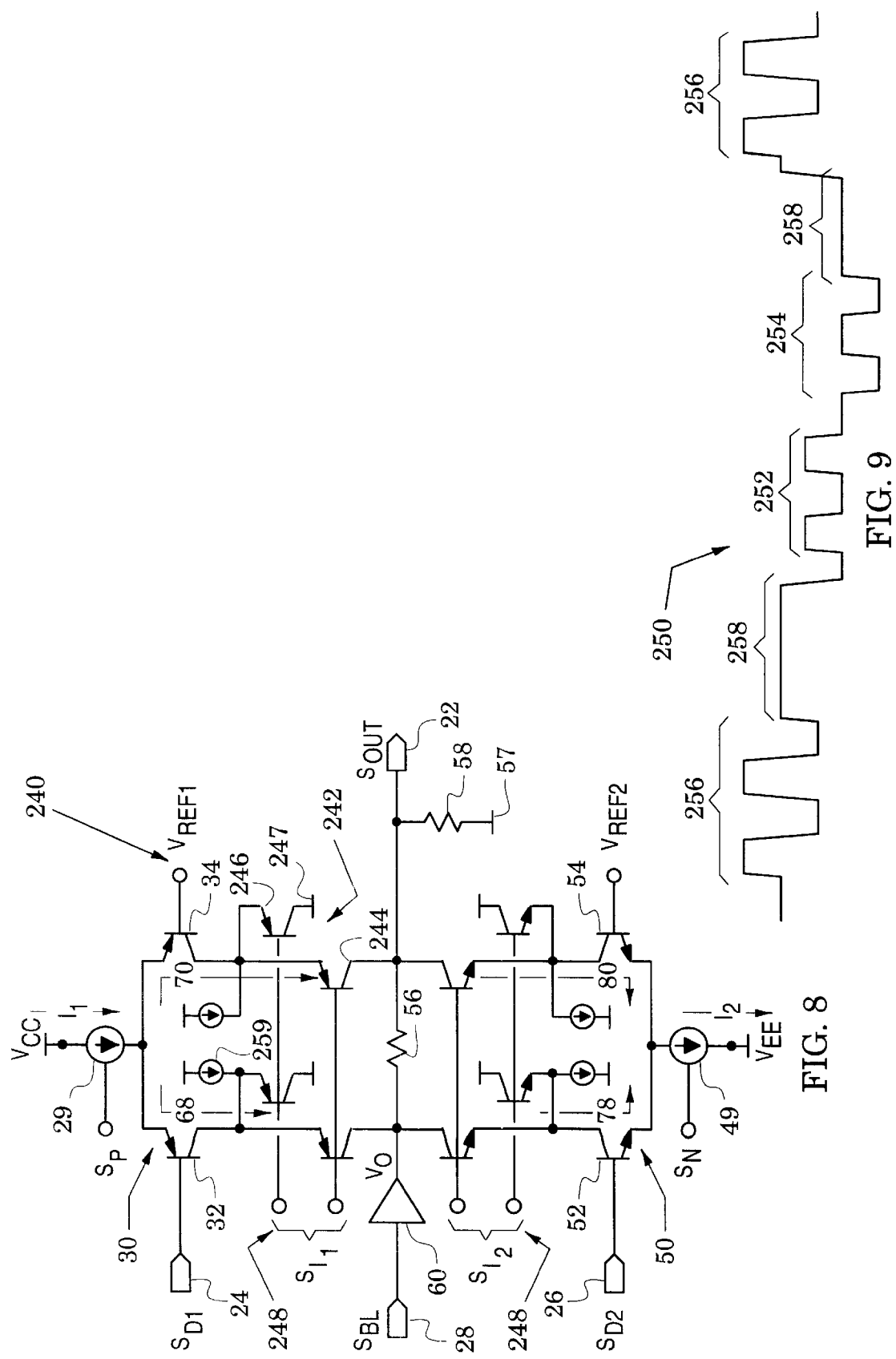

ATE PIN ELECTRONICS WITH COMPLEMENTARY WAVEFORM DRIVERS

BACKGROUND OF THE INVENTION

1. Field of the Invention

The present invention relates generally to waveform drivers and, more particularly, to their use in pin electronics for automatic test equipment (ATE).

2. Description of the Related Art

An exemplary use of transistor waveform drivers can be found in the field of ATE where test waveforms are generated and applied to leads of devices under test (DUTs). Because these waveforms are typically applied via an ATE "pin" (i.e., a probe), circuits configured for this purpose are also referred to as "pin drivers" and comprise a more general class of support circuitry commonly referred to as ATE "pin electronics". Preferably, the magnitudes and baseline components of pin-driver waveforms can be individually adjusted over ranges that accommodate a variety of DUTs and, in addition, the waveforms should have fast, symmetric rising and falling edges with minimal transients. Because ATE systems typically employ a large number (e.g., 1024) of pin drivers, the drivers are preferably realized with simple, inexpensive circuits.

A first exemplary pin driver is shown in U.S. Pat. No. 4,572,971 to couple a level selector circuit to a DUT with a buffer circuit. The level selector circuit is arranged to accommodate reference voltages that represent both small and large voltage swings. In response to first and second reference voltages and a current switch, the level selector circuit generates a signal equal to a selected one of the reference voltages at an output node. The output node signals are applied to the DUT through a unity-gain buffer circuit having two stages that each comprise a complementary emitter follower.

A second exemplary pin driver is disclosed in U.S. Pat. No. 5,842,155 which couples a pulse forming circuit to a DUT with buffer and amplifier stages. The pulse forming network responds to high and low signal inputs by respectively charging and discharging a network node with currents of equal and opposite magnitudes so as to achieve pulses having equal positive and negative slew rates between pulse magnitudes equal to the high and low inputs. The pulses thus formed at the network node are then applied to the DUT through unity-gain buffer and amplifier stages which each comprise a complementary emitter follower structure.

Although these exemplary pin drivers can generate pulse signals with controlled amplitudes, they fail to provide for independent adjustment of a baseline component and are relatively complex (e.g., the pulse forming circuit and buffer and amplifier stages of U.S. Pat. No. 5,842,155 include 11 transistors and the components of U.S. Pat. No. 4,572,971 are even more numerous.

FIG. 1A shows another pin driver 5 that is formed with a buffer amplifier 6, a differential pair 7 and a resistor 8. The resistor couples a DUT to the output 9 of the buffer amplifier and a collector of one of the differential pair's transistors is also coupled to the DUT. A level-controlling signal can then be applied to the input 10 of the buffer amplifier and a data signal (e.g., a digital signal) applied to the differential control terminals 11 of the differential pair. In response to the data signal, the differential pair steers the current 12 of a programmable current source 13 to and away from the collector that is coupled to the DUT. Thus, the level of the signal applied to the DUT can be controlled with the level-controlling signal and its amplitude controlled with the programmed current of the current source.

Although this latter pin driver circuit facilitates the automatic control required in ATEs and is much simpler and accordingly less expensive than the first and second exemplary pin drivers, its generated waveforms depart from the desired symmetry and amplitude. For example, FIG. 1B illustrates a typical waveform 14. The differential pair of the pin driver pulls the programmed current across the resistor (8 in FIG. 1A) and, accordingly, the falling edge 15 of the waveform 14 is steep and linear as it descends to the lower waveform level 16. There is a pronounced overshoot 17, however, as the falling edge transitions to the lower level 16.

In addition, the rising waveform edge 18 exhibits an exponential characteristic as it returns to the upper level 19 of the waveform 14. The rising waveform is generated when the differential pair steers the programmed current away from the resistor. Current to bring the waveform to the upper level 19 is then limited by the resistor (8 in FIG. 1A), and the exponential shape results as this current charges stray circuit capacitance (e.g., collector capacitance of the differential pair).

It is anticipated that the depth of the lower waveform level 16 is given by the product of the steered current (12 in FIG. 1A) and the resistance of the resistor. It has been observed, however, that the lower level typically assumes an error level 16E that differs from the anticipated level 16. The error level is generated because the output impedance of the amplifier (6 in FIG. 1A) typically has a nonzero value and current flow across this impedance adds an additional error term. Furthermore, this error term has a nonlinear characteristic, making it difficult to correct with conventional system calibration techniques.

Because the performance of modern electronic circuits is constantly increasing, there is a demand for test circuits that can generate waveforms whose precision is superior to that of the waveform 14. In addition to applying test waveforms to DUTs, modern ATEs are also generally required to verify that the DUT can sink or source specified pin currents and to verify that the DUT provides specified response waveforms. To provide these functions at each DUT lead, the respective ATE pin electronics preferably includes a waveform driver, an active load and a comparator.

SUMMARY OF THE INVENTION

The present invention is directed to waveform driver structures that generate precise, controllable waveforms and is further directed to ATE pin electronics formed with these structures.

These goals are realized with an amplifier and complementary-arranged first and second differential pairs of transistors. The first and second pairs are coupled to steer first and second currents to an output port in response to first and second input signals, and the amplifier is coupled to generate a baseline output signal at the output port in response to a baseline input signal. The first and second currents are preferably generated with programmable first and second current sources.

In an exemplary operation, all of the first and second currents are sequentially steered to and away from the output port in response to first and second input signals so that upper and lower levels of the output signal are determined by programming the magnitudes of the first and second currents. Thus, a variety of different waveforms can be synthesized in response to the programmed current sources, the first and second input signals, and the baseline input signal.

Transients of the generated waveforms are reduced by preferably referencing one input of each of the differential pairs to a fixed reference signal. To further enhance their operation, other waveform drivers of the invention buffer the first and second differential pairs with cascode transistors and include keep-alive current sources to improve dynamic response. To enhance variability of their output signals, other waveform drivers of the invention buffer the first and second differential pairs with inhibit switches formed with inhibit differential pairs.

The complementary structure of the waveform drivers generates steep, linear, symmetric waveform edges. In addition, this structure reduces the transistor currents required for a given voltage swing so that device power dissipation is greatly reduced. Accordingly, smaller devices can be used which generally improves waveform fidelity.

In another waveform driver embodiment, currents from the first and second differential pairs are coupled into the output of the amplifier to reduce waveform errors caused by the amplifier's nonzero output impedance.

ATE pin electronics of the invention are realized by adding active loads and comparators to the waveform drivers and coupling all of these components to a common pin for interface with DUT leads.

The novel features of the invention are set forth with particularity in the appended claims. The invention will be best understood from the following description when read in conjunction with the accompanying drawings.

BRIEF DESCRIPTION OF THE DRAWINGS

FIGS. 6, 7 and 8 are schematics of other waveform driver structures of the present invention;

FIG. 9 illustrates exemplary waveforms generated by the waveform driver of FIG. 8;

DETAILED DESCRIPTION OF THE PREFERRED EMBODIMENTS

Figure 2:
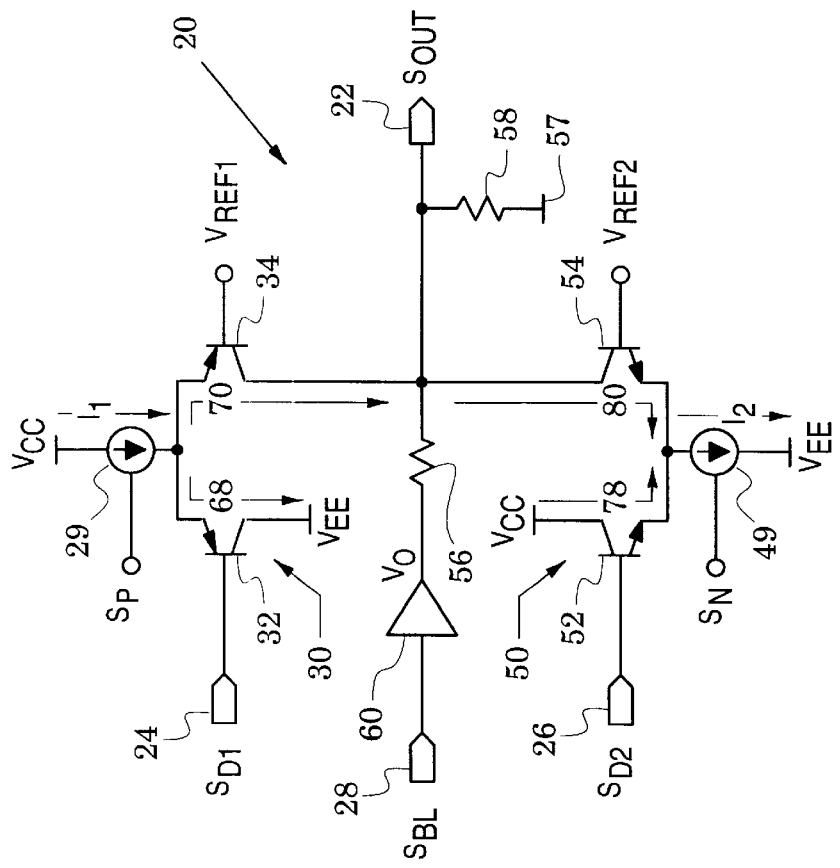
FIG. 2 is a schematic of a waveform driver embodiment of the present invention.

FIG. 2 illustrates a waveform driver embodiment 20 that generates an output signal $S_{OUT}$ at an output port 22 in independent response to first and second data signals $S_{D1}$ and $S_{D2}$ at data input ports 24 and 26 and a baseline signal $S_{BL}$ at a baseline input port 28. Because the output signal $S_{OUT}$ responds independently to these input signals, a variety of different output waveforms can be generated.

In particular, a first current source 29 generates a current $I_1$ whose amplitude responds to a signal $S_P$ and this current source is coupled between a positive supply voltage $V_{CC}$ and the emitters of a differential pair 30 of transistors 32 and 34. The base and collector of transistor 32 are coupled respectively to data input port 24 and a negative supply voltage $V_{EE}$. The base and collector of transistor 34 are coupled respectively to a first reference voltage $V_{REF1}$ and the output port 22.

In a similar manner, a second current source 49 generates a current $I_2$ whose amplitude responds to a signal $S_N$ and this current source is coupled between negative supply voltage $V_{EE}$ and the emitters of a differential pair 50 of transistors 52 and 54. The base and collector of transistor 52 are coupled respectively to data input port 26 and the positive supply voltage $V_{CC}$. The base and collector of transistor 54 are coupled respectively to a second reference voltage $V_{REF2}$ and the output port 22.

An output impedance device in the form of a resistor 58 may be added between a potential 57 (e.g., ground) and the output port 22 and a coupling impedance device in the form of a resistor 56 couples an amplifier 60 to the output port 22. The input of the amplifier 60 is connected to the baseline input port 28.

In operation of the waveform driver 20, the differential pair 30 receives a current $I_1$ of the current source 29 and responds to the first data signal $S_{D1}$ by steering this current through one or the other of its collectors as indicated by currents 68 and 70. The output impedance of the amplifier 60 is substantially zero so that the current 70 flows through a parallel impedance ($R_{56} \| R_{58}$) of the resistors 56 and 58 and generates a positive signal $S_1$ equal to (current 70)× ($R_{56} \| R_{58}$).

The differential pair 50 complements the differential pair 30 and responds to the second data signal $V_{D2}$ by steering currents 78 or 80 through one or the other of its collectors to supply a current $I_2$ of the current source 49 and thereby generate a negative signal $S_2$ equal to (current 80)× ($R_{56} \| R_{58}$).

The amplifier 60 responds to its input signal $S_{BL}$ by generating an output signal $V_O$ that is related to the baseline signal $S_{BL}$ by the gain of the amplifier. This gain need not be greater than one, but the amplifier 60 it is preferably a complementary buffer amplifier (i.e., one capable of actively sourcing and sinking currents).

The output signal $S_{OUT}$ at the output port 22, therefore, is a sum of the signals $S_1$, $S_2$ and $V_O$. Accordingly, the baseline component of the output signal is linearly responsive to the baseline signal $S_{BL}$ while the output signal is varied in a positive direction in response to the data signal $S_{D1}$ and varied in a negative direction in response to the data signal $S_{D2}$. In a particular case in which the data signals $S_{D1}$ and $S_{D2}$ are of equal magnitude but have translated voltage levels, a signal is generated symmetrically at the output port 22 about a signal mid-point that is determined by the baseline signal $S_{BL}$.

Circuit simulations were run on the waveform driver 20 in which realistic circuit parasitics (e.g., capacitances) were assumed. With $I_1 = I_2 = 500$ microamps, $S_{BL} = 0$ and source and load resistances of 50 ohms, the 25 millivolt peak-to-peak waveform 90 of FIG. 3A was generated with steep, linear, symmetric rising and falling edges 92 and 93 between upper and lower levels 94 and 95. In addition, the waveform 90 exhibited only a slight undershoot 96 at the bottom of the falling edge and a slight overshoot 97 at the top of the rising edge.

Figure 3A:
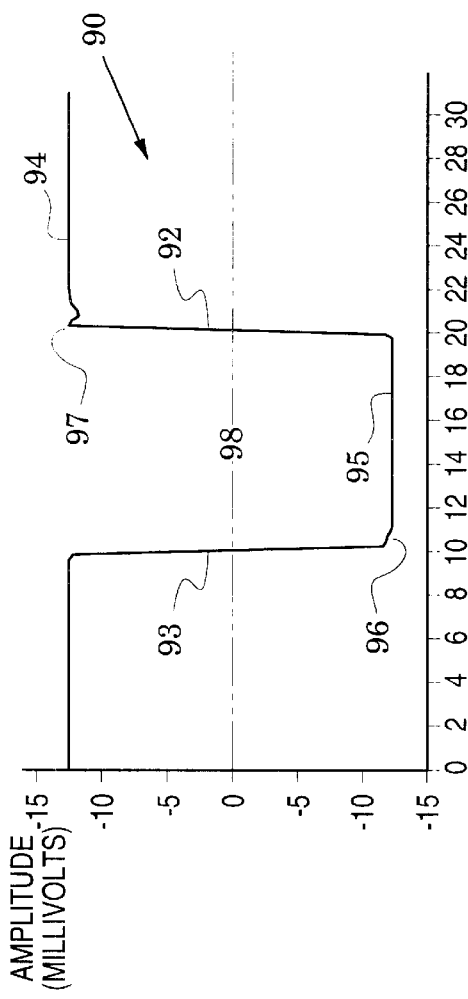
FIGS. 3A–C illustrate exemplary waveforms generated by the waveform driver of FIG. 2.
Figure 3B:
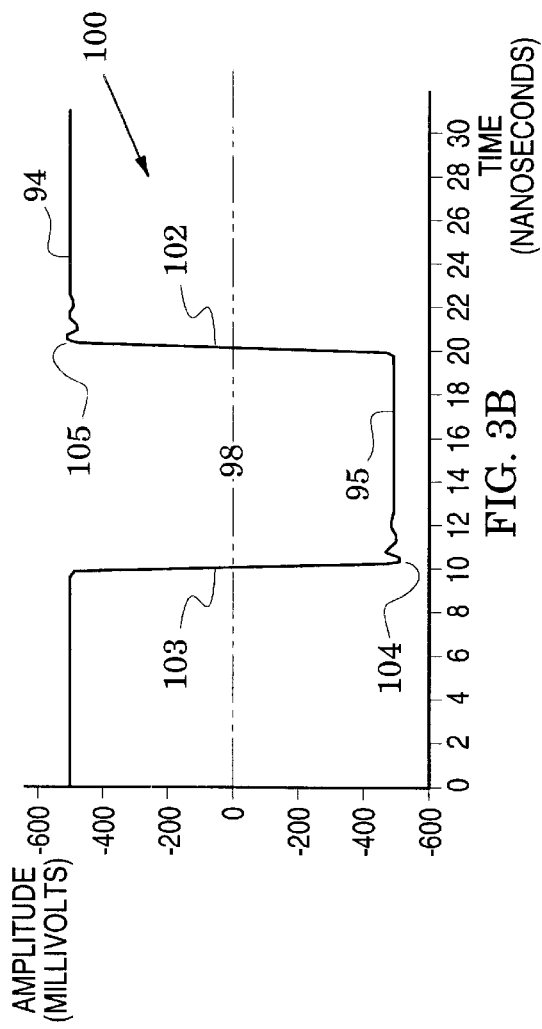

When $I_1$ and $I_2$ were increased to 20 milliamps, the 1000 millivolt peak-to-peak waveform 100 of FIG. 3B was produced. The rising and falling edges 102 and 103 were still steep, linear and symmetric with respective overshoots 104 and 105 that were slightly increased from the overshoot 97 of FIG. 3A. Although the simulation was based on a baseline component 98 equal to zero volts, the waveforms of FIGS. 3A and 3B can be shifted about various positive and negative baseline levels by appropriate baseline signals $S_{BL}$ at the baseline input port (28 in FIG. 2).

In the configuration of FIG. 2, all of the current $I_1$ is typically steered to sequentially form currents 68 and 70. Thus, the upper level 94 of FIG. 3A is adjusted by programming the magnitude of the current $I_2$ of FIG. 2. Similarly, all of the current $I_2$ is typically steered to sequentially form currents 78 and 80 so that the lower level 95 is adjusted by programming the magnitude of the current $I_2$ of FIG. 2. The baseline level of the output signal is responsive to the baseline input signal $S_{BL}$.

Figure 3C:
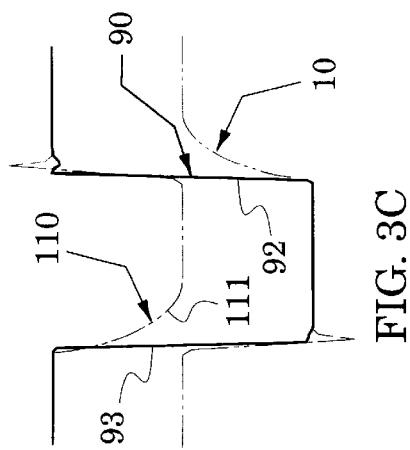

The improved waveforms of FIGS. 3A and 3B are realized because of the complementary relationship of the differential pairs 30 and 50 of FIG. 2. This is illustrated in FIG. 3C which repeats the waveform 14 of FIG. 1B in broken lines. This waveform will be generated at the output port 22 of FIG. 2 with the differential pair 50 in response to an appropriate input pulse at input port 26. FIG. 3C also shows a broken-line waveform 110 that would be generated at the output port 22 of FIG. 2 with the differential pair 30 in response to the same input pulse at input port 24 (with its level adjusted to account for the difference between reference voltages $V_{REF1}$ and $V_{REF2}$).

For comparison, the waveform 90 of FIG. 3A is superimposed over the waveforms 14 and 110. It is theorized that the steep falling edge 93 is primarily due to the falling edge (15 in FIG. 1B) of the waveform 14 and that the exponential shape 111 of the waveform 110 accounts for the absence in the waveform 90 of the pronounced overshoot (17 in FIG. 1B) of the waveform 14.

Similarly, it is theorized that the steep rising edge 92 is primarily due to the rising edge of the waveform 110 and that the exponential shape (18 in FIG. 1B) of the waveform 14 causes the waveform 90 to have only a slight overshoot (97 in FIG. 3A) at the top of its rising edge.

Several other advantageous features are facilitated by the structure of the waveform driver 20. Transistors 34 and 54 of FIG. 2 generally have parasitic capacitances $C_p$ across their base-collector junctions. It has been found that if the differential pairs 30 and 50 are driven with differential signals, these capacitances act as current pumps to introduce significant transients into the output signal (e.g., at locations 96 and 97 in FIG. 3A). By coupling the bases of transistors 34 and 54 to fixed reference signals ($V_{REF1}$ and $V_{REF2}$ in FIG. 2), it has been found that this pumping effect is significantly reduced with consequent reduction of output transients. In this configuration, the transistors 34 and 54 essentially act as cascode transistors that isolate the driver output from the changing input signals $S_{D1}$ and $S_{D2}$.

Because the upper and lower signal levels 94 and 95 of FIGS. 3A and 3B are generated with complementary active currents, the magnitude of the currents ($I_1$ and $I_2$ in FIG. 2) are one half that required by a conventional class-A driver for a given voltage swing. Accordingly, power dissipation in each of the differential pairs is reduced by a factor of two so that the use of smaller transistors is facilitated. These smaller devices typically have lower parasitic impedances with consequent improvement in waveform fidelity, especially for small output signal swings (e.g., 25 mv).

Finally, because components of the output signal respond independently to first and second input signals $S_{D1}$ and $S_{D2}$ and an input baseline signal $S_{BL}$, output signals of various shapes, baseline components, phases and frequencies can be synthesized.

Figure 4:
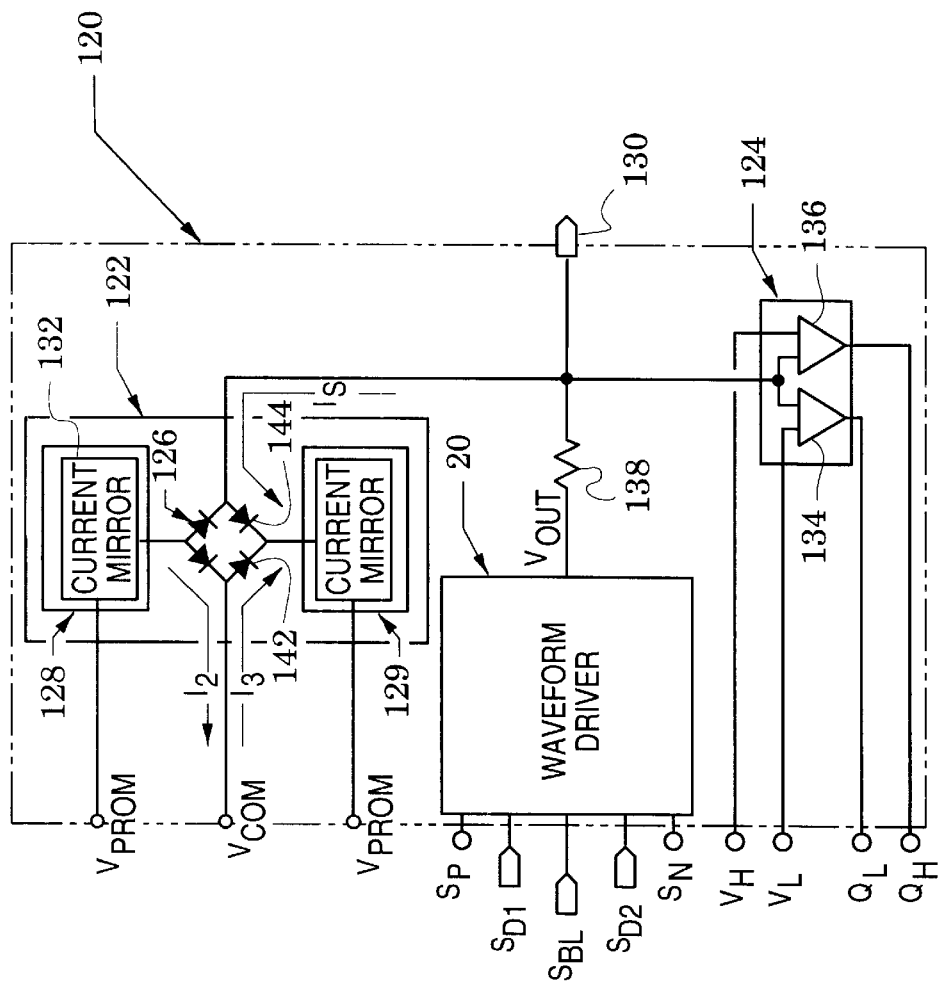
FIG. 4 is a block diagram of an ATE pin electronics embodiment of the present invention.

FIG. 4 illustrates a pin electronics circuit 120 that combines a programmable active load 122 and a response comparator 124 with the waveform driver 20 of FIG. 2. The active load positions a diode bridge 126 between programmable current sources 128 and 129. One side of the bridge is supplied with a commutation voltage $V_{COM}$ and the other side is coupled to a pin 130 that is configured to contact a DUT component, e.g., a DUT lead. The current sources are arranged to source and sink current to and from the bridge and are typically implemented with current mirrors 132 whose current magnitudes respond to programmable voltages $V_{PROM}$.

The response comparator 124 is typically a window comparator formed with first and second comparators 134 and 136 that each have an input coupled to the pin 130 and another input respectively connected to programmable high and low input reference voltages $V_H$ and $V_L$. Comparator output signals appear at ports $Q_H$ and $Q_L$ and indicate whether DUT response signals are within the range $V_H$–$V_L$ or not. The output port 22 of the waveform driver 20 may be coupled to the output pin 130 by an impedance-matching resistor 138 that reduces reflections of DUT signals as they travel to and from the pin.

Because it includes the waveform driver 20, the comparator 124 and the active load 122, the pin electronics circuit 120 might also be referred to as a driver/comparator/load or DCL.

In its operation, the pin electronics circuit 120 generates and applies test waveforms with its waveform driver 20, measures DUT response signals with its response comparator 124 and applies specified current sinks or sources with its active load 122. All of these functions are coupled to a DUT by the pin 130. The flexible but relatively straightforward structure of the pin electronics circuit 120 facilitates its use in large numbers in ATEs for simultaneous testing of multiple DUT leads.

In an exemplary test of a DUT that is to source 1 milliamp while delivering 5 volts at the pin 130, the current source 129 would be set to sink 1 milliamp and the commutation voltage $V_{COM}$ set to a voltage less than 5 volts. If the DUT meets its specifications, its source current $I_S$ flows as shown to the current source 129 while a second current $I_2$ flows from the current source 128 and through the other side of the bridge 126. If the DUT cannot source the specified 1 milliamp, a third current $I_3$ flows through diode 142 so that $I_S+I_3$ equals the 1 milliamp sink current of the current source 129. Because diodes 142 and 144 are now both in conduction, the voltage at the pin 130 must equal $V_{COM}$. The fact this is below the DUTs specified 5 volts is sensed by the comparator 124.

Figure 5:
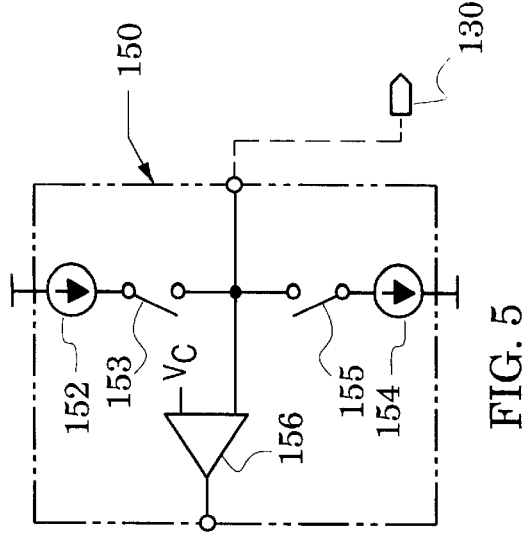
FIG. 5 is a conceptual diagram of a programmable active load for use in the pin electronics of FIG. 4.

The teachings of the pin electronics circuit 120 can be practiced with a variety of conventional active loads. For example, FIG. 5 illustrates another active load 150 which couples current sources 152 and 154 to the pin 130 with switches 153 and 155. The potential of the pin is measured with a comparator 156. A specified source or sink current can thus be switched to the pin 130 while a DUT voltage at the pin 130 is measured and compared to a specified voltage.

In the waveform driver 20 of FIG. 2, the steered currents 68 and 78 return to the power supplies that generate the supply voltages $V_{CC}$ and $V_{EE}$. Because this wasted current decreases the efficiency of the driver, it may be preferable to use the waveform driver 200 of FIG. 6. This driver is similar to the driver 20 of FIG. 2 with like elements indicated by like reference numbers. However, the collector of transistor 32 and the collector of transistor 52 are connected to the output port of the amplifier 60 to increase efficiency.

Figure 1A:
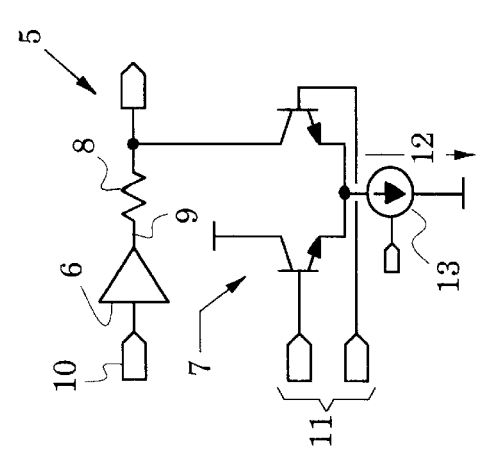
FIG. 1A illustrates a conventional pin driver.
Figure 1B:
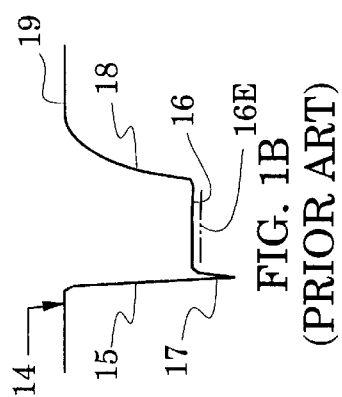
FIG. 1B illustrates a typical waveform generated by the pin driver of FIG. 1A.

In addition, this arrangement reduces the amplifier's static current load and enhances waveform accuracy. For example, if the differential pair 50 steers the current 80 across the resistor 56, the output signal $S_{OUT}$ falls to a lower level such as the level 16 shown earlier in FIG. 1B. Although the output impedance of the amplifier 60 can be assumed to be zero for most purposes, it typically has a nonzero value. With reference to FIG. 1B, it was stated above that current flow across this nonzero output impedance introduces an error component so that the waveform floor falls to an error level (16E in FIG. 1B).

In the waveform driver 200, however, the differential pair 30 steers the current 68 into the output of the buffer amplifier 60 to generate a compensating voltage drop across the nonzero output impedance and this substantially nulls out the error component. Accordingly, the waveform floor will be substantially where it is anticipated to be (i.e, at 16 in FIG. 1B). In particular, if $I_1=I_2$ and the output load impedance (e.g., resistor 58) is infinite, then the static current load of the amplifier 60 is zero and error in the lower waveform level is eliminated.

The waveform driver 220 of FIG. 7 is similar to the driver 200 of FIG. 6 with like elements indicated by like reference numbers. The driver 220, however, has diodes 222 coupled between the current source 29 and the emitters of the differential pair 30 and diodes 224 coupled between the current source 49 and the emitters of the differential pair 50. This facilitates coupling of current sources 226 to the emitters of the differential pair 30 and current sources 228 to the emitters of the differential pair 50.

If the data signals $S_{D1}$ and $S_{D2}$ drive the currents 68 and 78 to zero in the driver 20 of FIG. 2, the performance of transistors 32 and 52 is degraded because the unity-gain frequency $f_T$ of transistors drops with lowered currents. This lowering of $f_T$ is mitigated in the waveform driver 220 because these transistors continue to conduct the keep-alive currents of their respective current sources 226 and 228. Each keep-alive current source is directed into an appropriate transistor by its respective diode.

Because they continue to conduct current, and because potentials of their terminals is established at all times, the turn-on response of the transistors 32 and 52 is improved. A similar improvement is realized for transistors 34 and 54 in situations in which currents 70 and 80 would otherwise drop to zero. These circuit structures also improve response performance of the cascode transistors 230. To further enhance the speed of the waveform driver 220, the diodes 222 and 224 are preferably Schottky diodes.

In the waveform driver 200 of FIG. 6, the transistors of the differential pairs 30 and 50 operate with collector-emitter voltages and collector currents that vary with the signal levels at the output port 22. Accordingly, the thermal heating of these transistors is a function of signal levels and duty cycles, and this induces differences in their characteristics (e.g., base-to-emitter voltage) and their performance (e.g., turn-on and turn-off times) which may cause the waveform driver to exhibit undesirable traits (e.g., timing skews).

Accordingly, the waveform driver 220 also has transistors 230 coupled in cascode configuration (common base) with the collectors of the differential pairs 30 and 50. The cascode transistors have a reference voltage $V_R$ coupled to their bases which sets a known and unchanging potential at the collectors of the differential pairs 30 and 50. Because their collector-to-emitter voltages are substantially reduced and are now constant, the thermal variations (and possible degraded performance) of the waveform driver 200 are also substantially reduced. The cascode transistors 230 now differ in their thermal heating but this does not affect driver performance because these transistors are not involved in the steering of currents $I_1$ and $I_2$.

FIG. 8 shows a waveform driver 240 that is similar to the driver 200 of FIG. 6 with like elements indicated by like reference numbers. The driver 240 also includes differential pairs 242 that are arranged so that a first transistor 244 of each differential pair acts as the cascode transistor 230 of FIG. 7, and a second bypass transistor 246 of each differential pair is coupled to a potential 247.

The bases of the differential pairs 242 form switch ports 248 at which inhibit signals $S_{I_1}$ and $S_{I_2}$ can be applied. In a first polarity mode of the inhibit signals, currents (e.g., the current 78) are steered through the first cascode-arranged transistor 244 of each differential pair 242 and in a second polarity mode, currents are steered through the second bypass transistor 246 of each differential pair.

In response to the first polarity mode, the waveform driver 240 operates similarly to the waveform driver 200—the signal at the output port 22 would respond to the baseline input signal at the input port 28 and would also respond to the first and second data signals at the input ports 24 and 26.

In response to the second polarity mode, the steered currents of the differential pairs 30 and 50 flow through the second transistors 246 of each differential pair 242 so that the operational action of the differential pairs 30 and 50 are inhibited. In this inhibited mode, the signal at the output port 22 would only respond to the baseline input signal at the input port 28.

Alternatively, the polarities of the inhibit signals $S_{I_1}$ and $S_{I_2}$ can be opposite so that the output signal at the output port 22 would then respond to the baseline input signal and to one of the first and second data signals.

These operational modes are exemplified in the output waveform 250 of FIG. 9 which has signal portions 252 in which only positive pulses are generated, signal portions 254 in which only negative pulses are generated, signal portions 256 in which both positive and negative pulses are generated and signal portions 258 which have no pulses but which demonstrate various baseline signal levels.

In the driver 200 of FIG. 6, current is generally steered at any given time through only one transistor (e.g., the transistor 32) of each differential pair 30 and 50. Preferably, the second transistor (e.g., the transistor 34) of the pair responds rapidly in response to a data signal that is intended to steer the current through the second transistor. This response is enhanced if the second transistor is conducting at least a keep-alive current. Accordingly, the driver 240 of FIG. 8 also includes keep-alive current sources 259 that are coupled to the differential pairs 240. Even when not carrying one of the steered currents $I_1$ and $I_2$, therefore, a cascode-arranged transistor 244 will still be carrying a small keep-alive current when not in the inhibited mode of operation.

Figure 10:
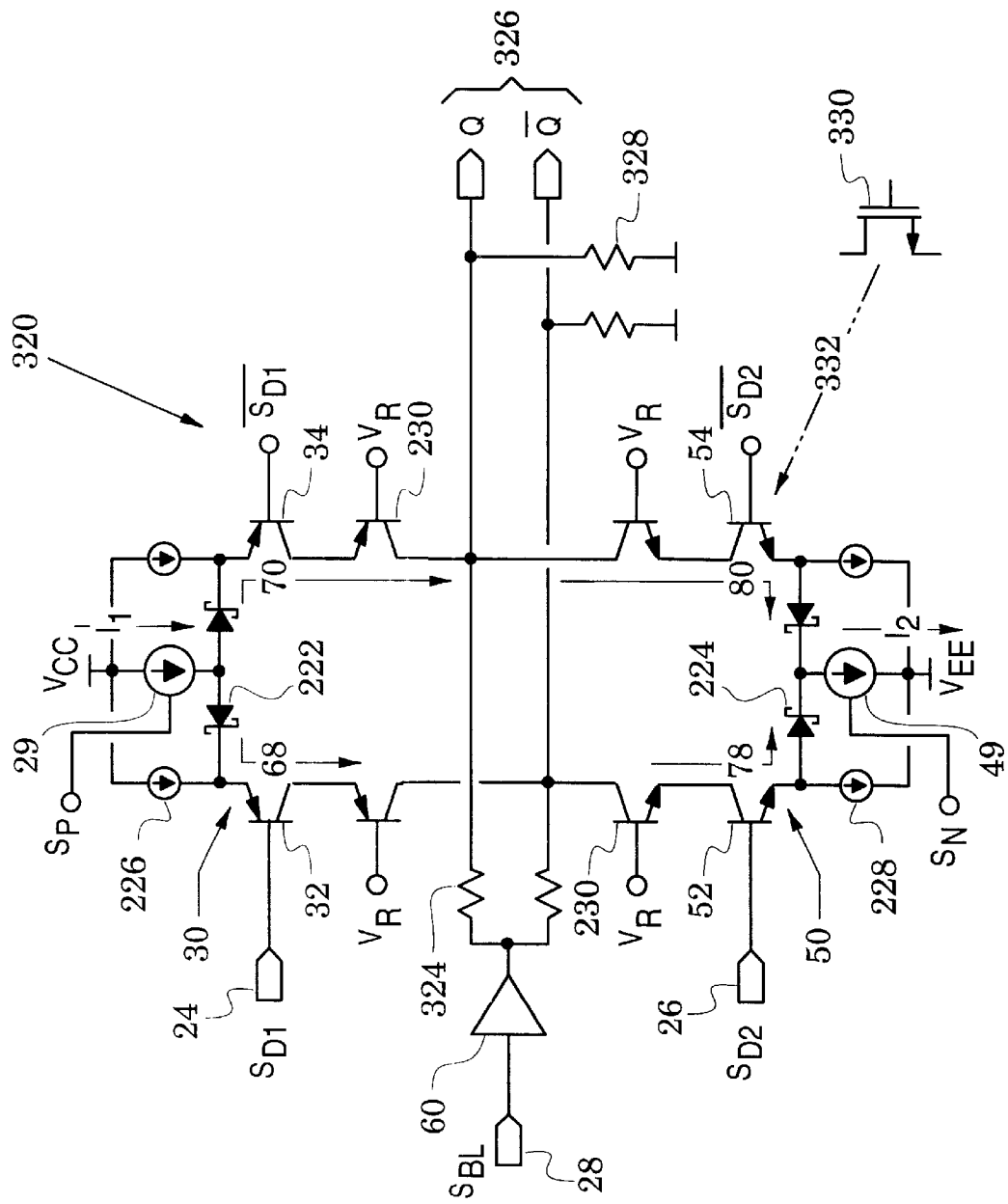
FIG. 10 is a schematic of another waveform driver of the present invention.

The waveform driver 320 of FIG. 10 represents a differential version of the waveform driver 220 of FIG. 7. The waveform driver 320 is similar to the driver 220 with like elements indicated by like reference numbers. However, the amplifier 60 is coupled to a differential output port 326 by series resistors 324 and Q and Q-bar terminals of the output port 326 are each connected to a parallel load resistor 328. Each resistor 324 and a respective side of the output port 326 are coupled to respective sides of the differential pairs 30 and 50.

Figure 11:
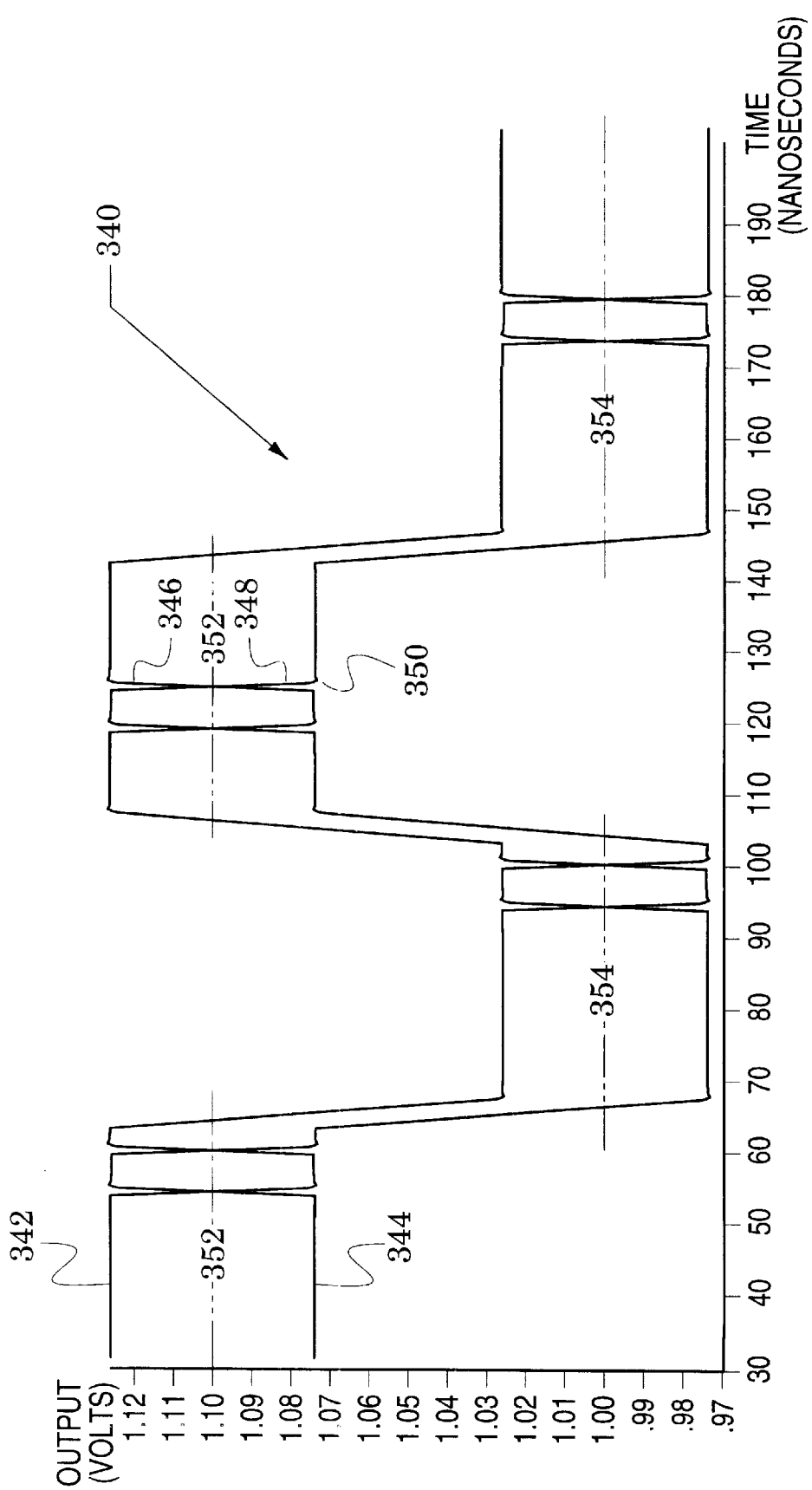
FIG. 11 illustrates exemplary waveforms generated by the waveform driver of FIG. 10.

FIG. 11 illustrates a differential waveform 340 obtained in performance simulations on a circuit similar to the waveform driver 320 of FIG. 10. Traces 342 and 344 are the differential signals generated at Q and Q-bar of the differential output port (326 in FIG. 10) in response to the data inputs ($S_{D1}$ and $S_{D2}$ in FIG. 10). To generate this waveform, a common signal was used for both data inputs while the baseline input signal ($S_{BL}$ in FIG. 10) was varied to establish two baseline levels 352 and 354. It has been found that attributes (e.g., symmetry) of differential waveforms may be enhanced by driving the differential pairs 30 and 50 in a differential fashion (e.g., with differential data signals $S_{D1}$ and $S_{D1}$-bar and differential data signals $S_{D2}$ and $S_{D2}$-bar as shown in FIG. 10).

It is noted that the traces exhibit steep, linear, symmetric rising and falling edges 346 and 348 with minimal overshoots 350. The signal levels 352 and 354 demonstrate rapid changes in the baseline component of the waveform 340 in response to the baseline input signal ($S_{BL}$ in FIG. 10). In the differential driver 320, the baseline component of the output signal is the common-mode signal between Q and Q-bar and the fidelity of the common-mode transistions is determined by the amplifier 60. The waveform 340 particularly demonstrates the fidelity, rapid response and flexibility of complementary waveform drivers of the invention.

The teachings of the invention have been illustrated with particular reference to bipolar transistors but they may be practiced with various transistor types. For example, the bipolar transistors of the waveform drivers may be replaced with equivalent CMOS transistors. This is exemplified in FIG. 10 where a CMOS transistor 330 replaces a bipolar transistor 54 as indicated by a replacement arrow 332.

Buffer amplifiers (e.g., amplifier 60 of FIG. 2) of the invention may be any of various conventional low-output-impedance, high-frequency complementary amplifiers, e.g., as shown in FIG. 3 of U.S. Pat. No. 5,179,293 to Hilton and FIG. 2 of U.S. Pat. No. 5,842,155 to Bryson, et al.

Waveform drivers of the invention include differential pairs of transistors. As is well known, one current terminal of each of these transistors is typically coupled to a current source and the source's current is steered to other transistor current terminals in response to control signals at transistor control terminals.

These waveform drivers may be used for the generation of waveforms with various amplitudes and baseline components and having fast rising and falling edges (e.g., ~200–300 picoseconds) and high frequencies (e.g., ~1 GHz). They are particularly suited for use as ATE pin drivers. They are also suitable for realization as high-speed application specific integrated circuits (ASICs) which can reduce their size and cost when produced in large volumes.

The preferred embodiments of the invention described herein are exemplary, and numerous modifications, variations and rearrangements can be readily envisioned to achieve substantially equivalent results, all of which are intended to be embraced within the spirit and scope of the invention as defined in the appended claims.

I claim:

1. A waveform driver that generates an output signal at an output port in response to first and second input signals and a baseline input signal, the driver comprising:

an amplifier that generates a baseline output signal at an amplifier output in response to said baseline input signal;

an impedance device that couples said amplifier output to said output port;

a first differential pair of first and second transistors that respectively respond to said first input signal and to a first fixed reference signal and wherein said first differential pair is coupled to steer a first current to said output port in response to said first input signal; and a second differential pair of third and fourth transistors that respectively respond to said second input signal and to a second fixed reference signal and wherein said second differential pair is coupled to steer a second current from said output port in response to said second input signal;

said output signal thereby increased from said baseline output signal in response to said first input signal and decreased from said baseline output signal in response to said second input signal.

2. The waveform driver of claim 1, wherein outputs of said first and third transistors are coupled to said amplifier output and outputs of said second and fourth transistors are coupled to said output port.

3. The waveform driver of claim 1, further including first and second current sources that generate said first and second currents.

4. The waveform driver of claim 1, wherein said amplifier is a complementary amplifier.

5. The waveform driver of claim 1, wherein said transistors are bipolar transistors.

6. A waveform driver that generates an output signal at an output port in response to first and second input signals and a baseline input signal, the driver comprising:

a first differential pair of first and second transistors coupled to steer a first current to said output port in response to said first input signal;

a second differential pair of third and fourth transistors coupled to steer a second current from said output port in response to said second input signal;

an amplifier coupled to generate a baseline output signal at said output port in response to said baseline input signal; and a coupling impedance device having a first end coupled to said amplifier and having a second end coupled to said output port;

and further including at least one inhibit differential pair of transistors wherein said inhibit differential pair has a first one of its transistors inserted between a respective one of said first and second ends and a transistor of a respective one of said first and second differential pairs and has the other of its transistors coupled to a potential source, activation of said other transistor thereby inhibiting operation of said respective differential pair.

7. The waveform driver of claim 6, further including a keep-alive current source coupled for steering of a keep-alive current through said inhibit differential pair.

8. A waveform driver that generates an output signal at an output port in response to first and second input signals and a baseline input signal, the driver comprising:

a first differential pair of first and second transistors coupled to steer a first current to said output port in response to said first input signal;

a second differential pair of third and fourth transistors coupled to steer a second current from said output port in response to said second input signal;

an amplifier coupled to generate a baseline output signal at said output port in response to said baseline input signal; and first and second current sources that generate said first and second currents;

and further including:

a first keep-alive current source coupled to at least one transistor of said first differential pair;

a first diode coupled between said first keep-alive current source and said first current source;

a second keep-alive current source coupled to at least one transistor of said second differential pair; and a second diode coupled between said second keep-alive current source and said second current source.

9. A waveform driver that generates an output signal at an output port in response to first and second input signals and a baseline input signal, the driver comprising:

an amplifier that generates a baseline output signal at an amplifier output in response to said baseline input signal;

a resistor that couples said amplifier output to said output port;

a first differential pair of first and second transistors that responds to said first signal by steering a first current to said output port; and a second differential pair of third and fourth transistors that responds to said second signal by steering a second current from said output port;

and wherein:

said first transistor is coupled to receive said first input signal and said second transistor is referenced to a fixed first signal level; and said second transistor is coupled to receive said second input signal and said second transistor is referenced to a fixed second signal level;

said output signal thereby increased from said baseline output signal in response to said first input signal and decreased from said baseline output signal in response to said second input signal.

10. The waveform driver of claim 9, further including a second resistor connected to form an output impedance at said output port.

11. The waveform driver of claim 9, wherein said transistors are bipolar transistors.

12. The waveform driver of claim 9, wherein said amplifier is an complementary amplifier.

13. A waveform driver that generates an output signal at an output port in response to first and second input signals and a baseline input signal, the driver comprising:

an amplifier that responds to said baseline input signal;

a resistor having first and second ends that are respectively coupled to said amplifier and to said output port;

a first differential pair of first and second transistors that responds to said first signal by steering a first current to either selected one of said first and second ends; and a second differential pair of third and fourth transistors that responds to said second signal by steering a second current from either selected one of said first and second ends;

and further including:

first and second current sources that generate said first and second currents;

a first keep-alive current source coupled to at least one transistor of said first differential pair;

a first diode coupled between said first keep-alive current source and said first current source;

a second keep-alive current source coupled to at least one transistor of said second differential pair; and a second diode coupled between said second keep-alive current source and said second current source.

14. A waveform driver that generates an output signal at an output port in response to first and second input signals and a baseline input signal, the driver comprising:

an amplifier that responds to said baseline input signal;

a resistor having first and second ends that are respectively coupled to said amplifier and to said output port;

a first differential pair of first and second transistors that responds to said first signal by steering a first current to either selected one of said first and second ends; and a second differential pair of third and fourth transistors that responds to said second signal by steering a second current from either selected one of said first and second ends;

and wherein:

said first differential pair has a first input port coupled to receive said first input signal and has a second input port that is referenced to a fixed first signal level; and said second differential pair has a first input port coupled to receive said second input signal and has a second input port that is referenced to a fixed second signal level;

and further including:

first and second cascode transistors that are each inserted between a respective one of said first and second ends and said first differential pair; and third and fourth cascode transistors that are each inserted between a respective one of said first and second ends and said second differential pair.

15. A pin electronics circuit that loads an output port, measures response signals at said output port and generates an output signal at said output port in response to first and second input signals and a baseline input signal, the pin electronics circuit comprising:

an active load coupled to source and sink currents to and from said output port;

a comparator coupled to receive and measure said response signals at said output port;

a first differential pair of transistors coupled to steer a first current to said output port in response to said first input signal;

a second differential pair of transistors coupled to steer a second current from said output port in response to said second input signal; and an amplifier coupled to generate a baseline output signal at said output port in response to said baseline input signal;

and wherein:

said first differential pair has a first input port coupled to receive said first input signal and has a second input port that is referenced to a fixed first signal level; and said second differential pair has a first input port coupled to receive said second input signal and has a second input port that is referenced to a fixed second signal level.

16. The pin electronics circuit of claim 15, wherein said comparator is a window comparator.

17. The pin electronics circuit of claim 15, further including a coupling impedance device having a first end coupled to said amplifier and having a second end coupled to said output port.

18. The pin electronics circuit of claim 15, further including first and second current sources that generate said first and second currents.

19. A pin electronics circuit that loads an output port, measures response signals at said output port and generates an output signal at said output port in response to first and second input signals and a baseline input signal, the pin electronics circuit comprising:

an active load coupled to source and sink currents to and from said output port;

a comparator coupled to receive and measure said response signals at said output port;

a first differential pair of transistors coupled to steer a first current to said output port in response to said first input signal;

a second differential pair of transistors coupled to steer a second current from said output port in response to said second input signal; and an amplifier coupled to generate a baseline output signal at said output port in response to said baseline input signal;

and wherein said active load includes first and second programmable current sources coupled to said output port.

20. The pin electronics circuit of claim 19, wherein said active load further includes a diode bridge that couples said first and second current sources to said output port.

21. The pin electronics circuit of claim 19, wherein said active load further includes first and second switches that respectively couple said first and second current sources to said output port.

22. A pin electronics circuit that loads an output port, measures response signals at said output port and generates an output signal at said output port in response to first and second input signals and a baseline input signal, the pin electronics circuit comprising:

an active load coupled to source and sink currents to and from said output port;

a comparator coupled to receive and measure said response signals at said output port;

a first differential pair of transistors coupled to steer a first current to said output port in response to said first input signal;

a second differential pair of transistors coupled to steer a second current from said output port in response to said second input signal; and an amplifier coupled to generate a baseline output signal at said output port in response to said baseline input signal;

and further including at least one inhibit differential pair of transistors wherein said inhibit differential pair has a first one of its transistors inserted between a respective one of said first and second ends and a transistor of a respective one of said first and second differential pairs and has the other of its transistors coupled to a potential source, activation of said other transistor thereby inhibiting operation of said respective differential pair.

23. The pin electronics circuit of claim 22, further including a keep-alive current source coupled to said inhibit differential pair.

24. A method of providing a multilevel test signal at a test port, comprising selectively:

a) from an output port of an amplifier, providing a first-level test signal to said test port with a resistor that couples said amplifier output to said test port;

b) inserting a first current through said resistor and into said amplifier output to thereby increase said first-level test signal to a second-level test signal at said test port; and c) pulling a second current from said amplifier output and through said resistor to thereby decrease said first-level test signal to a third-level test signal at said test port.

25. The method of claim 24, wherein said inserting step includes the step of:

d) changing the amplitude of said first current to thereby convert said second-level test signal to a fourth-level test signal at said test port.

26. The method of claim 24, wherein said pulling step includes the step of:

d) changing the amplitude of said second current to thereby convert said third-level test signal to a fifth-level test signal at said test port.

27. The method of claim 24, further including the step of coupling a device under test (DUT) to said test port to receive said first-level, second-level and third-level signals.

* * * * *